United States Patent
Copperthite et al.

(10) Patent No.: US 7,407,079 B2
(45) Date of Patent: Aug. 5, 2008

(54) AUTOMATED FILAMENT ATTACHMENT SYSTEM FOR VACUUM FLUORESCENT DISPLAY

(75) Inventors: Theodore J. Copperthite, Ladera Ranch, CA (US); Todd J. Walker, Lake Forest, CA (US); Vartan Babayan, Huntington Beach, CA (US); Martin R. Nicholls, Costa Mesa, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 652 days.

(21) Appl. No.: 10/692,706

(22) Filed: Oct. 23, 2003

(65) Prior Publication Data

US 2005/0087585 A1   Apr. 28, 2005

(51) Int. Cl.
B23K 37/00   (2006.01)
B23K 37/04   (2006.01)

(52) U.S. Cl. ............... 228/4.5; 228/44.3; 228/180.5
(58) Field of Classification Search ............ None
See application file for complete search history.

(56) References Cited

U.S. PATENT DOCUMENTS

| | | | | | |
|---|---|---|---|---|---|
| 3,216,640 | A | * | 11/1965 | Szasz | 228/4.5 |
| 3,347,422 | A | * | 10/1967 | Mead et al. | 222/146.3 |
| 3,430,834 | A | * | 3/1969 | Mansour et al. | 228/1.1 |
| 3,627,192 | A | * | 12/1971 | Killingsworth | 228/54 |
| 3,672,556 | A | * | 6/1972 | Diepeveen | 228/49.5 |
| 3,689,983 | A | * | 9/1972 | Eltzroth et al. | 228/180.5 |
| 3,747,198 | A | * | 7/1973 | Benson et al. | 228/111 |
| 3,934,783 | A | * | 1/1976 | Larrison | 228/110.1 |
| 4,028,798 | A | * | 6/1977 | Bechard et al. | 29/838 |
| 4,030,657 | A | * | 6/1977 | Scheffer | 228/1.1 |
| 4,415,115 | A | * | 11/1983 | James | 228/170 |
| 4,597,520 | A | * | 7/1986 | Biggs | 228/111 |
| 4,645,118 | A | * | 2/1987 | Biggs et al. | 228/170 |
| 4,778,097 | A | * | 10/1988 | Hauser | 228/44.7 |
| 4,781,319 | A | * | 11/1988 | Deubzer et al. | 228/4.5 |
| 4,976,392 | A | * | 12/1990 | Smith et al. | 228/102 |
| 5,190,206 | A | * | 3/1993 | Miller et al. | 228/102 |
| 5,217,154 | A | * | 6/1993 | Elwood et al. | 228/4.5 |
| 5,288,007 | A | * | 2/1994 | Interrante et al. | 228/119 |
| 5,364,004 | A | * | 11/1994 | Davidson | 228/1.1 |

(Continued)

FOREIGN PATENT DOCUMENTS

JP   04-65833 A * 3/1992

(Continued)

OTHER PUBLICATIONS

TBD-ACC-No. NN9310589 (Oct. 1993).*

*Primary Examiner*—Kiley Stoner
(74) *Attorney, Agent, or Firm*—Tom Chen; MacPherson Kwok Chen & Heid, LLP.

(57) ABSTRACT

A filament attachment system includes a bond head comprising a de-spooling system with a spool and balanced dancer arm assembly, a clamp having a curved filament entry, a narrower gripping region, and a wider filament exit, and a bond tool comprising a guide portion, a grooving portion, and a staking portion. The grooving portion forms a groove into a bond and the staking portion closes the groove over the filament, securing the filament in the bond. Thus, the filament can be attached with a single pass of the bond head using a single bond.

5 Claims, 9 Drawing Sheets

U.S. PATENT DOCUMENTS

| | | | | |
|---|---|---|---|---|
| 5,387,305 | A | * | 2/1995 | Streng .................... 156/257 |
| 5,516,029 | A | * | 5/1996 | Grasso et al. ............ 228/180.5 |
| 5,558,270 | A | * | 9/1996 | Nachon et al. ........... 228/180.5 |
| 5,626,276 | A | * | 5/1997 | Lo et al. .................... 228/4.5 |
| 5,685,476 | A | * | 11/1997 | Miyoshi .................. 228/180.5 |
| 5,816,472 | A | * | 10/1998 | Linn .......................... 228/1.1 |
| 5,868,301 | A | * | 2/1999 | Distefano et al. ...... 228/180.21 |
| 5,894,981 | A | * | 4/1999 | Kelly ........................ 228/104 |
| 6,156,990 | A | * | 12/2000 | Ellis ....................... 219/56.21 |
| 6,750,926 | B2 | * | 6/2004 | Ohgiichi et al. ............... 349/40 |
| 6,905,058 | B2 | * | 6/2005 | Farassat ...................... 228/1.1 |
| 2002/0162875 | A1 | * | 11/2002 | Miller ........................ 228/4.5 |
| 2004/0112936 | A1 | * | 6/2004 | Hixon et al. ............... 228/44.3 |
| 2004/0232203 | A1 | * | 11/2004 | Gaunekar et al. .......... 228/44.3 |

FOREIGN PATENT DOCUMENTS

JP          2000058603   A   *   2/2000

* cited by examiner

AUTOMATED FILAMENT ATTACHMENT SYSTEM FOR VACUUM FLUORESCENT DISPLAY

BACKGROUND

1. Field of the Invention

The present invention relates to wire bonding devices, and in particular, to such bonding devices that attach filament.

2. Related Art

Conventional systems and methods for attaching filament to devices, such as semiconductor chips or displays, typically include a spool of filament, a de-spooler to unwind the filament, a dancer arm with a pulley to adjust tension in the filament as it is unwound, a filament guide, and an attaching means for attaching the filament. The attaching means may be a welding device, such as a laser welder or ultrasonic bonder. The device onto which the filament is to be attached can be held in place, while the attaching means moves to attach the filament at the selected portions of the device. Other types of spooled lines, such as bond wires, may utilize similar structures and methods.

Conventional devices include support structures onto which the filament is stretched across and attached, such as described in U.S. Pat. No. 6,509,693 to Yonezawa et al, which is incorporated by reference in its entirety. The support structures provide, in part, separation from underlying elements. This separation prevents the filament from sagging and contacting the underlying elements after the filament has been heated and expands. The structures allow each of the filaments to be fixed at one end and elastically held at the other end.

However, such a system can be costly due to the additional expense of manufacturing and securing the support structures onto the device. Furthermore, the support structures increase the overall thickness of the device. Moreover, the welding of the filament to the support structures may cause the filament coating, e.g., carbonate, to scatter into display areas of the device, thereby resulting in inferior or damaged displays.

U.S. Pat. No. 6,509,693, incorporated above, discloses another filament attachment system in which the filament is bonded between a wiring layer and a metal foil or wire. This requires two bonds or materials to secure the filament.

Accordingly, there is a need for a system for attaching filaments that overcomes the deficiencies in the prior art as discussed above.

SUMMARY

According to one aspect of the present invention, a filament attachment system includes a bond head having a de-spooler unit with a balanced dancer arm and spool, a clamp, and a bond tool with a guide region, a grooving region, and a staking region. According to another aspect, filament is attached to a single wire bond on a semiconductor device. The filament attachment system utilizes ultrasonic energy, along with force or pressure provided by the bond tool.

According to one embodiment, a filament is fed from the guide region, through the grooving region and the staking region of the bond tool. During an attachment process, the bond tool is brought down onto a wire bond, such as an aluminum bond, on a semiconductor device or display such that the filament is between the wire bond and the grooving region. The grooving region then forms a groove in the wire bond by ultrasonic energy and force (pressure) and embeds the filament in the bond. The bond tool moves perpendicular to the wire bond. Next, the staking region, which has a V-shape in one embodiment, impacts onto the bond, carves the material, and closes the bond material over the filament. This secures the filament within the wire bond, which strengthens the anchor of the filament into the bond. In one embodiment, the grooving region is between the guide region and the staking region, and all located on the bond tool. This allows the filament to be attached with only a single pass of the bond head or tool.

According to another embodiment, a filament or wire clamp, located adjacent to the filament guide of the bond tool, has opposing clamp halves that form a small curved taper opening at the wire entry side, with the sides of the halves extending away from each other such that the wire exit side is wider than the gripping region. The curved entry prevents both the coating or material from being removed from the filament and the filament from catching on the clamp upon entry. As the coiled filament passes through entry, the filament will hit the diverging walls of the opposing clamp halves, which will help the filament "tail" to stay straight upon exit from the clamp.

According a further embodiment, a de-spooling system, with a balanced dancer arm and spool, is located on the bond head. The dancer arm applies the necessary tension (e.g., similar tension applied during winding) to the filament as the filament is unwound from the spool. This aids in preventing the filament from catching or snagging (e.g., with underlying layers of filament on the spool), which would otherwise result in the filament coating flaking off. Because the de-spooling system is located on the bond head and, for example, not on top of the machine, any coating that does flake off will not drift into the machine and/or onto the path of the filament feed.

This invention will be more fully understood in conjunction with the following detailed description taken together with the following drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

Figure 1:
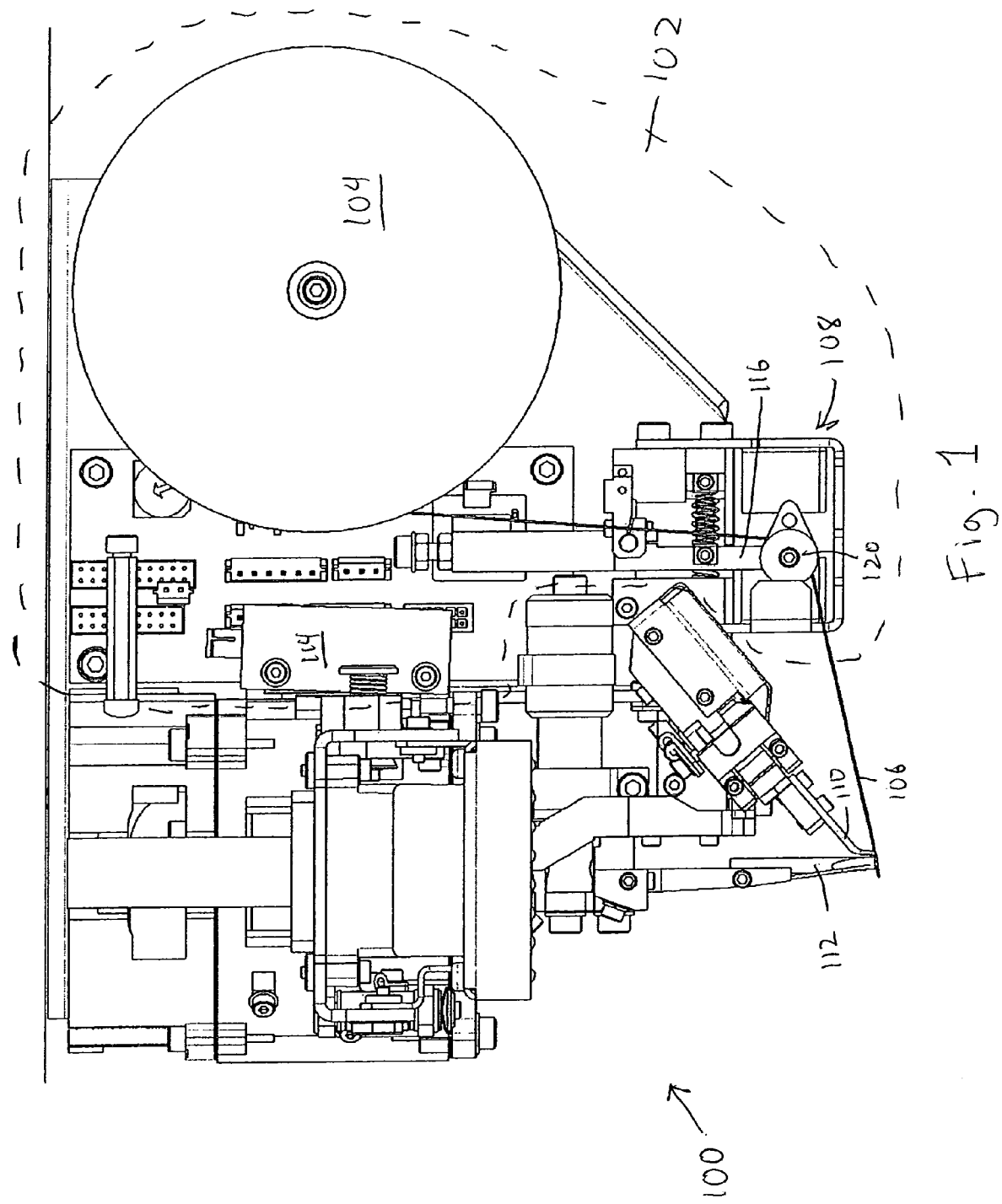
FIG. 1 shows a bond head, according to one embodiment of the invention.

FIG. 1 shows a bond head 100, as part of a filament or wire attachment system, according to one embodiment of the invention. Bond head 100 includes a de-spooling system 102 having a spool or reel 104 wound with a filament or wire 106 and a balanced dancer arm assembly 108, a filament or wire clamp 110, and a bond tool 112.

De-spooling system 102, according to one embodiment, is located on bond head 100. De-spooling system 102 includes a stepper motor 114 mechanically driving spool 104. Spool 104 is driven by motor 114 in an incremental manner. Motor 114 can be a two phase bi-polar load motor or any other stepper motor which does not spin freely. Also, to prevent free spinning of other types of drives, electromotive movement motors, servos or coils, a brake or drag system with the electromotive drive can be utilized. Motor 114 drives spool 104 incrementally, as filament 106 is unwound from spool 104, and thus, spool 104 is free to continuously rotate. Stepper motors in operation with spools to unwind wire or filament for wire bonding are known in the art. One such system is disclosed in commonly-owned U.S. Pat. No. 6,471,116, entitled "Wire Bonding Spool System", which is incorporated by reference in its entirety.

Filament 106 is conventionally wound onto spool 104 with a specific amount of tension. As a result, when filament 106 is unwound, the same or similar amount of tension must also be used. If too little or no tension is applied, the filament may snag or catch with the underlying layers of filament in the spool, thereby causing the coating on the filament to flake. Typically, a tungsten core wire is coated with a carbonate of Ba, Sr or Ca to form a filament. If the carbonate flakes off, it could adversely affect both the quality of the filament as well as the operation of the machine. However, if too much tension is applied, the filament coil pitch may be increased too much.

To address this issue, dancer arm assembly 108 with a dancer arm 116 is used to adjust the tension of the filament as it is being unwound. Dancer arm 116 is located between spool 104 and clamp 110 into which it feeds. Dancer arm 116 includes a moveable pulley 120. Filament 106 is pulled from spool 104, along pulley 120, and out toward clamp 110 and bond tool 112 as the bond head moves. The bond head can move in an X-Y-Z direction, along and over the top of a device onto which the filament is to be attached. This movement, which pulls filament 106 from spool 104 and through pulley 120, creates tension in the filament. The tension moves dancer arm 116, and a sensor (not shown) senses the increase in tension. In response, motor 114 turns spool 104 to decrease the amount of tension as needed.

Figure 2:
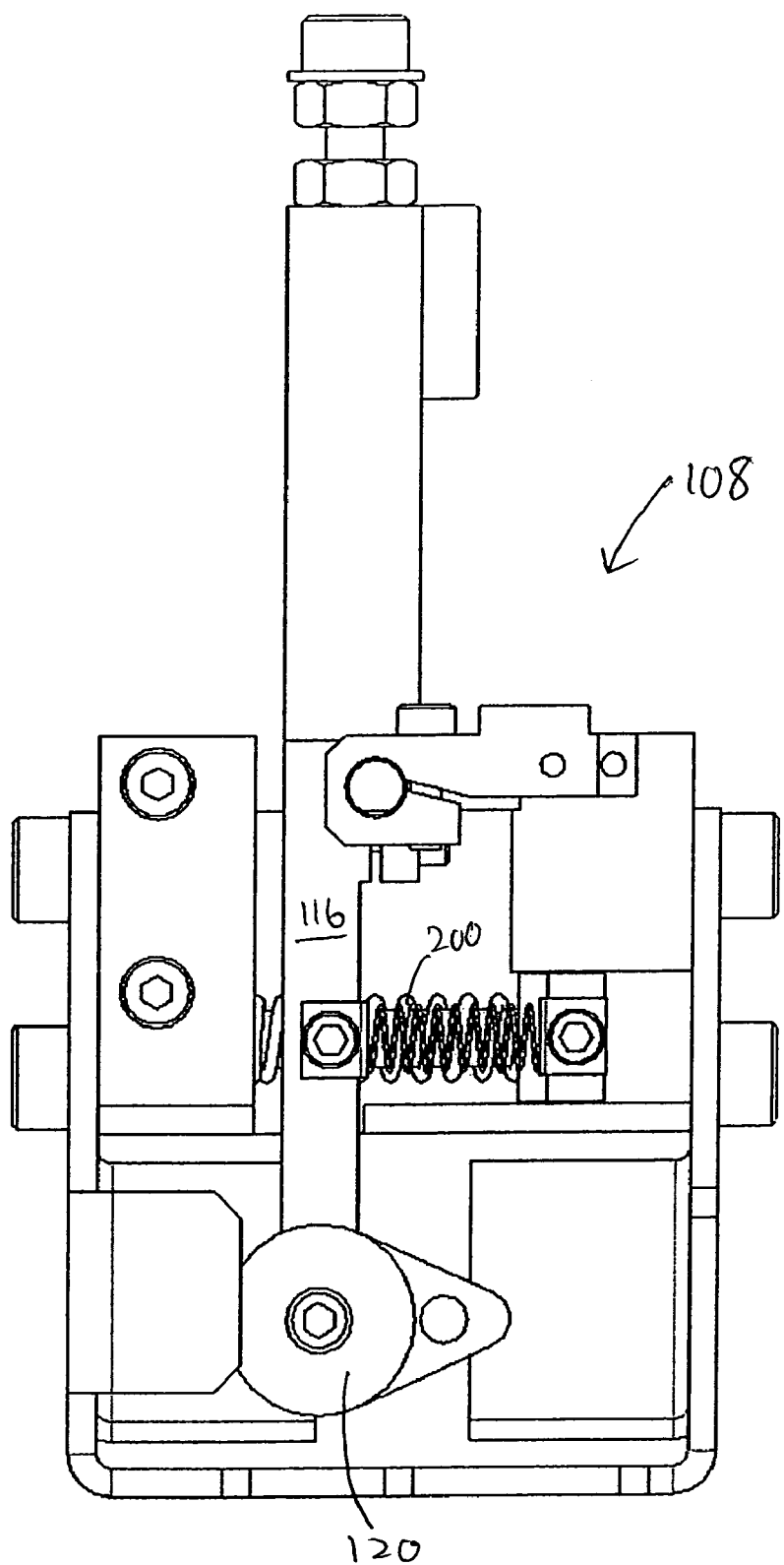
FIG. 2 shows an enlarged view of the dancer arm assembly of FIG. 1.
Figure 3:
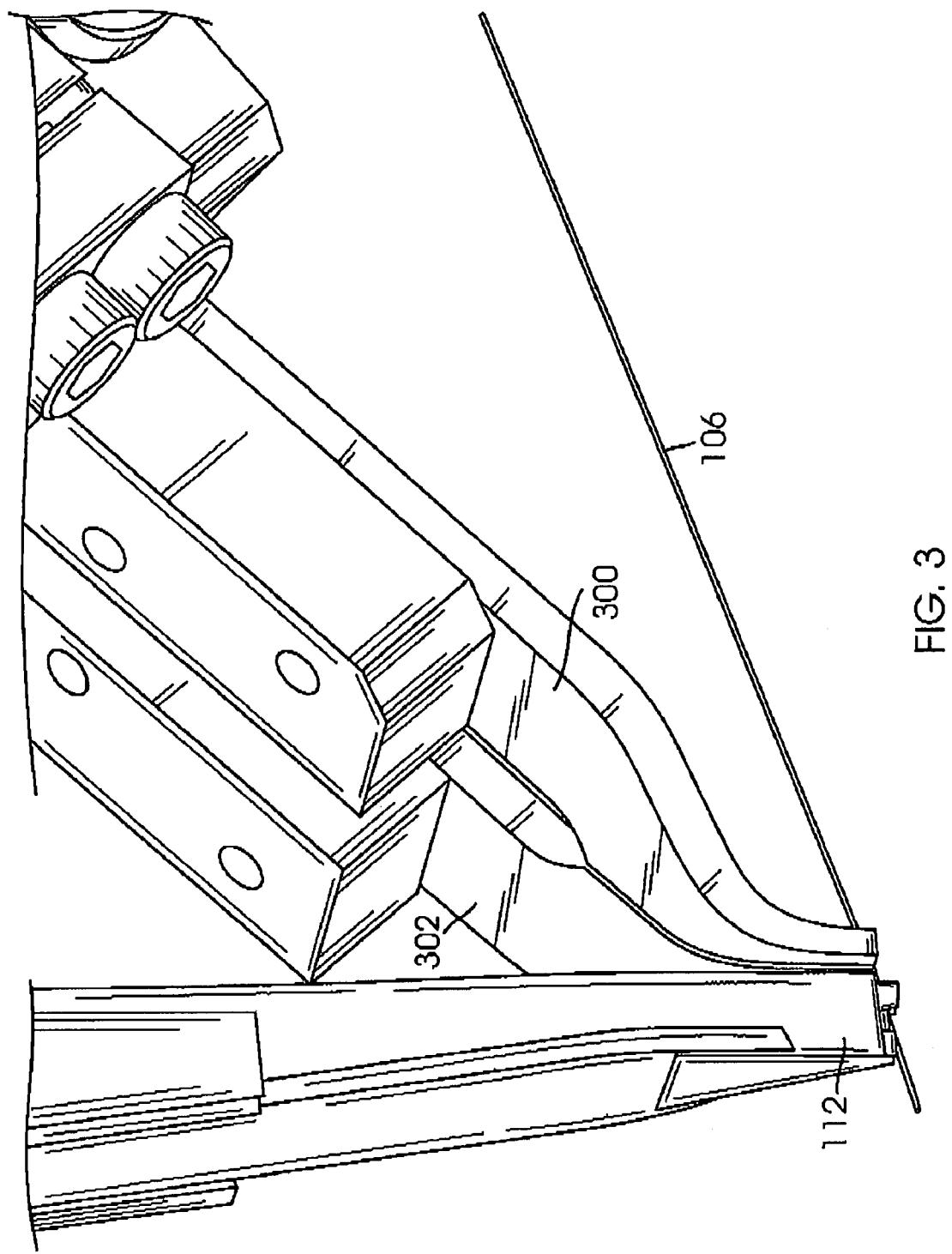
FIG. 3 shows an enlarged view of the bond tool and clamp of FIG. 1.

Dancer arm systems are known in the art and are typically placed on top of the bonding machine. Even with the use of dancer arms, coating could flake from the filament as the filament travels from the spool to the bond tool, such as through pulley 120. By placing the dancer arm assembly and spool on the bond head, according to one aspect of the present invention, any dislodged coating will not drop through the bonding machine, as with conventional systems. Consequently, areas that may be adversely affected by coating flakes are reduced. The length of the path and number of items contacting the filament are minimized by placing the despooling system on the bond head. FIG. 2 shows an enlarged portion of dancer arm assembly 108, in particular, dancer arm 116, a spring 200 biasing dancer arm 116 against the assembly, and pulley 120, which moves with dancer arm 116. As the bond head moves, filament 106 is paid out from the spool and fed through clamp 110 and bond tool 112 for attachment to an underlying device.

FIGS. 3-5 and 6A-6D show different views of clamp 110, according to one embodiment of the invention. Clamp 110 includes two opposing clamp arms 300 and 302. One of the clamp arms, for example, clamp arm 300 is stationary or fixed, while the other clamp arm, 302 in this example, is moveable. When filament 106 is initially moved into clamp 110, the moveable arm is opened up to allow the filament to be placed within the clamp. As seen from FIG. 3, filament 106 is held between clamp arms 300 and 302 of clamp 106 before passing to bond tool 112. Note that the term "held", as used herein refers to the case when the moveable clamp is closed to grip the filament. In the case that the moveable clamp is opened, the filament is not "held" rigidly, but is free to be paid out as needed during the attachment process.

Figure 4:
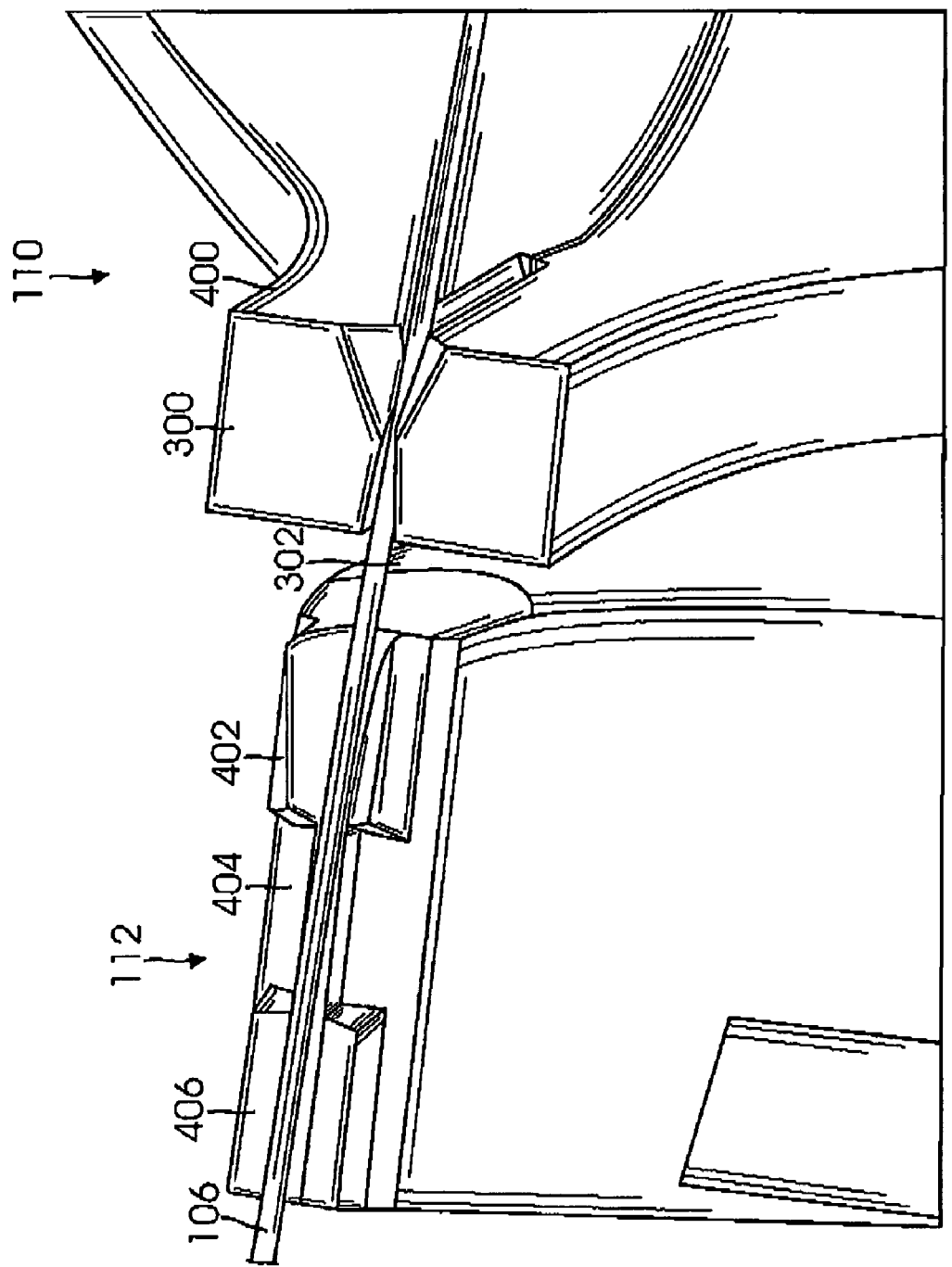
FIG. 4 shows a bottom view of the bond tool and a portion of the clamp of FIG. 1.
Figure 5:
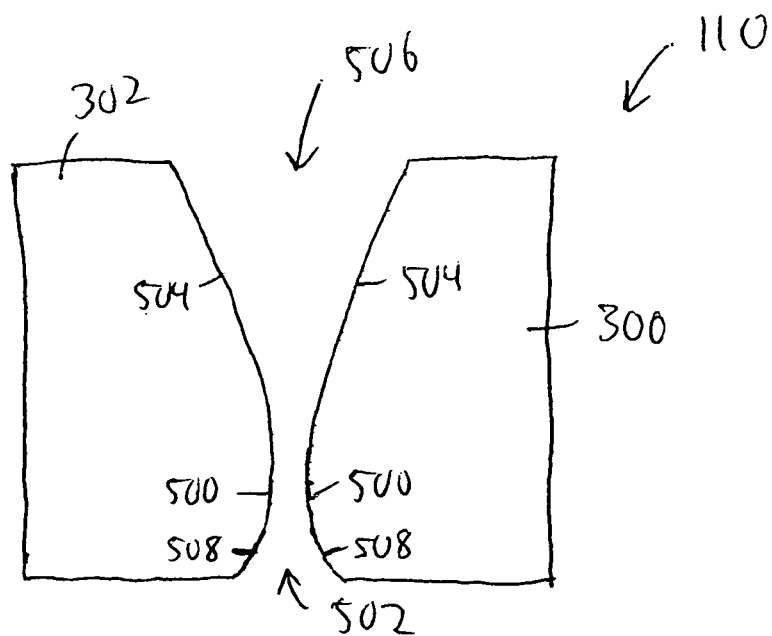
FIG. 5 shows a bottom view of the bond tool of FIG. 1.

FIGS. 4 and 5 show bottom views of clamp 110 at different angles. As seen from FIG. 4, clamp 110 has a flat bottom surface, with a tapered portion 400 on each clamp arm 300 and 302 at the filament entry side of the clamp. The taper allows the filament to re-enter the clamps if the filament drops below (or out) of the clamps during normal operation of the bond head. Also as seen from FIGS. 4 and 5, each of clamp arms 300 and 302 has a curved portion 508 at the entry 502 of the filament, forming a tapered entryway, which converges to a narrow gripping portion 500. The opposing sides 504 of the clamp arms then diverge so that the exit portion 506 is wider than the gripping portion 500. According to one embodiment, with a filament diameter of approximately 0.003", the width of the clamp opening at its narrowest point is approximately 0.001", widening to approximately 0.005" at the exit region.

Figure 7:
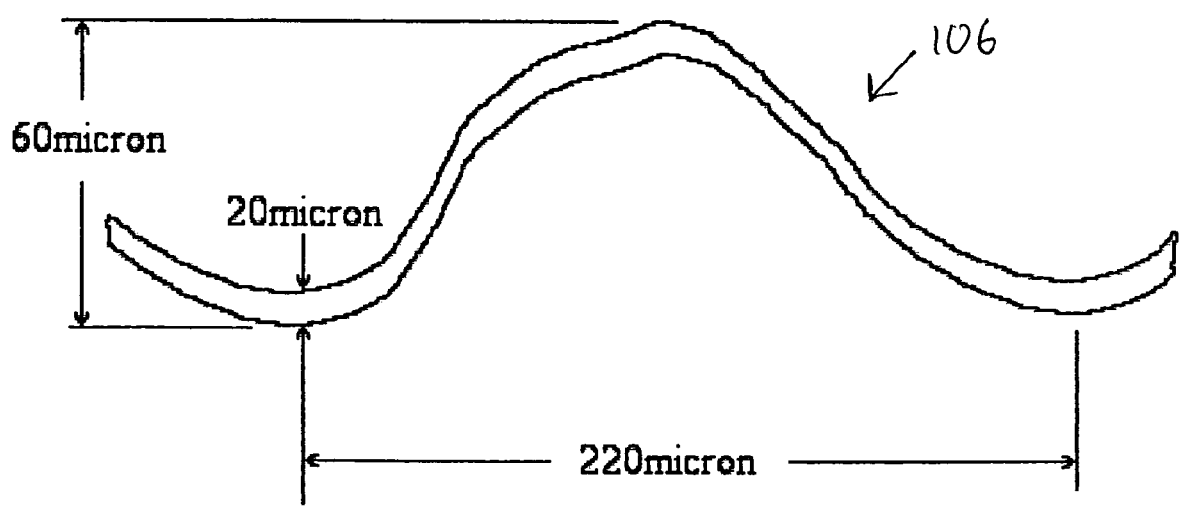
FIG. 7 shows an enlarged portion of a filament used in the clamp of FIGS. 6A-6D.
Figure 6A:
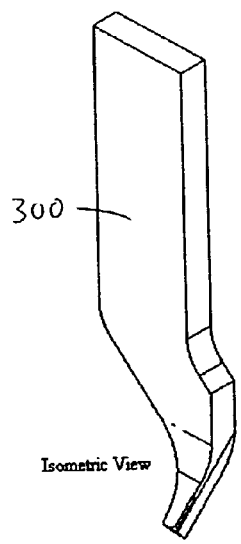
FIGS. 6A-6D shows different views of the clamp of FIGS. 3-5 according to one embodiment.
Figure 6B:
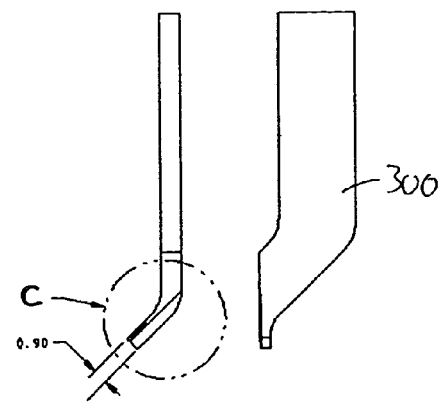
Figure 6C:
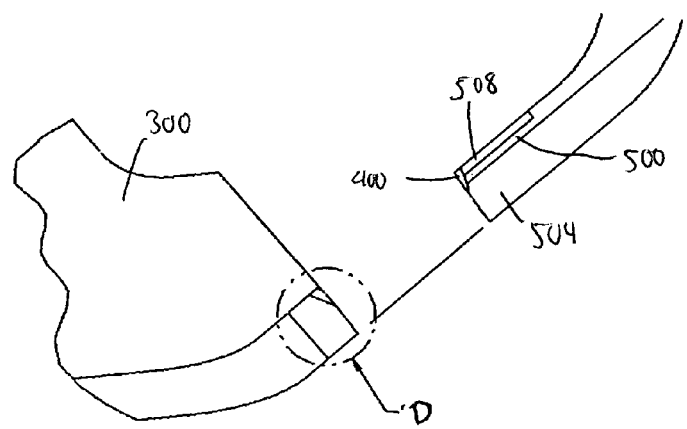
Figure 6D:
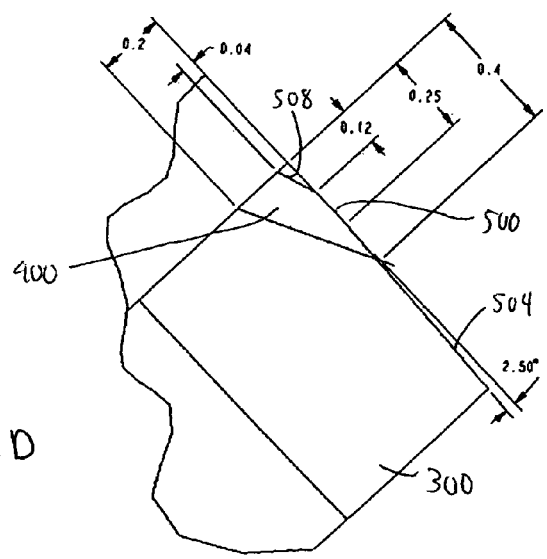

FIGS. 6A-6D show different views of one embodiment of clamp 110, with enlarged sections shown in FIGS. 6C and 6D, and dimensions in millimeters as noted. The portion C of FIG. 6B is shown enlarged in FIG. 6C, while the portion D of FIG. 6C is shown enlarged in FIG. 6D. FIG. 7 shows an enlarged view of one example of filament 106, which has a helical shape that appears sinusoidal when viewed from the side, with a peak-to-peak separation of approximately 220 microns, a peak-to-peak height of approximately 60 microns, and a thickness of approximately 20 microns.

Such a design allows the filament, which is coming as a helical coil, to enter bond tool 112 relatively straight. With conventional clamp designs having flat parallel opposing sides, the filament may be curved as it exits the clamp, making it more difficult for proper guiding and attachment. The smaller gripping region extending to the wider exit has been shown to keep the filament tail straight while the filament is clamped. The filament coils will alternately hit each of the diverging walls of the opposing clamp arms, which will help keep the filament tail straight as it exits the clamp. Further, the curved small entry of clamp 110 minimizes the possibility of the filament being scraped as the filament enters or moves through the clamp, which could cause flaking off of the coating from the filament or damage to the wire itself. With conventional clamps having flat parallel opposing sides, the filament has a greater chance of being scraped along a corner of the clamp.

Figure 8:
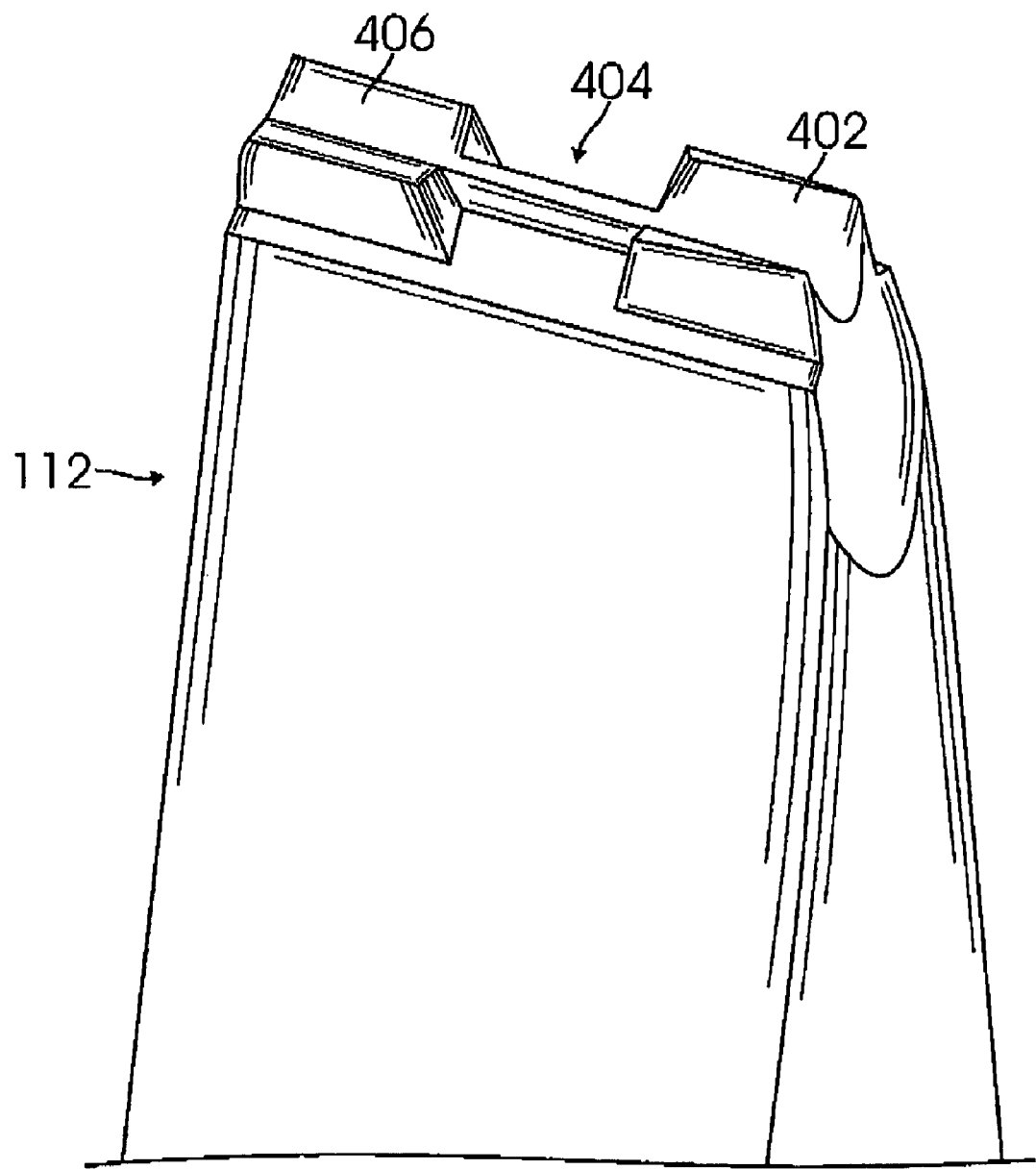
FIGS. 8 and 9 show enlarged views of the bond tool of FIG. 1.
Figure 9:
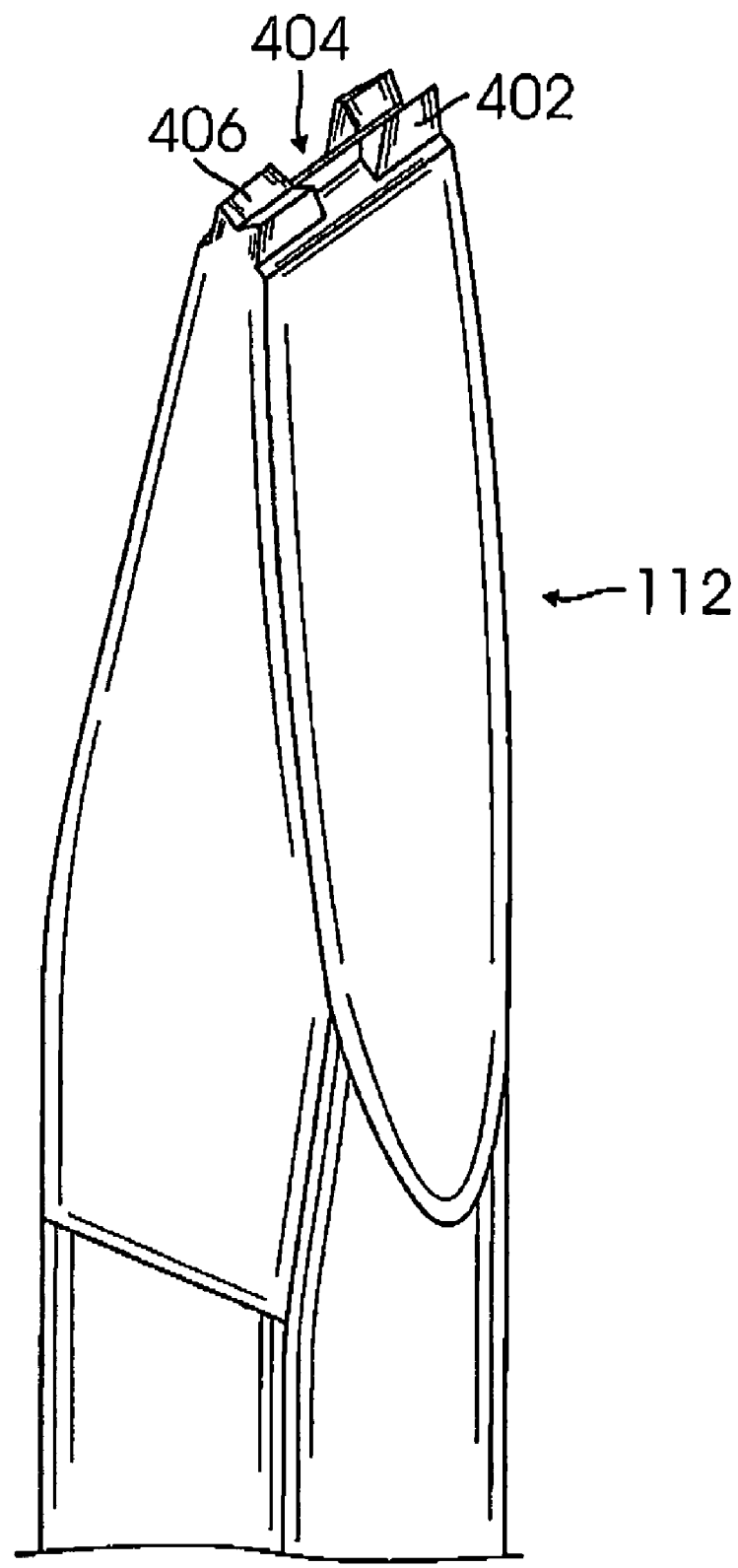

Referring back to FIG. 4, after exiting clamp 110, filament enters bond tool 112. In one embodiment, bond tool 112 includes three main sections: a guide portion 402, a grooving portion 404, and a staking portion 406. Typically, during operation, the filament only contacts all three sections when the bond head is brought down onto the bond during the grooving operation. FIGS. 8 and 9 show enlarged views of bond tool 112. Filament enters guide portion 402 from clamp 110. Guide portion 402 has a polished radius having a V-shape that guides the filament down into the center of the bond tool. As shown, the entry of the guide is larger than the exit, which makes the manufacturing process easier; however, this is not critical. The guided filament then extends through grooving portion 404 and staking portion 406. Grooving portion 404 has an inverted V-shape, with the filament sitting on the flattened top of the inverted V.

Figure 10A:
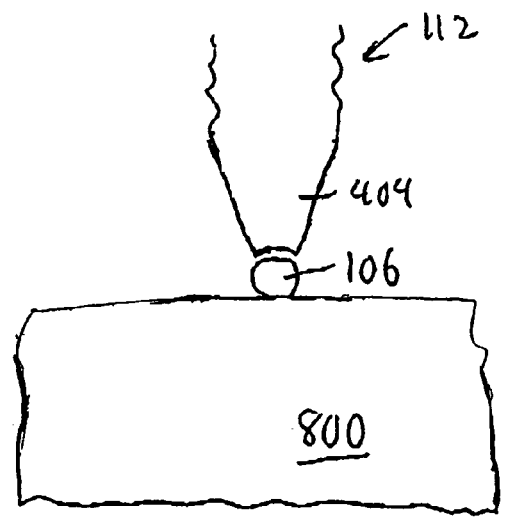
FIGS. 10A-10D shows steps of attaching a filament to a bond according to one embodiment of the invention.
Figure 10B:
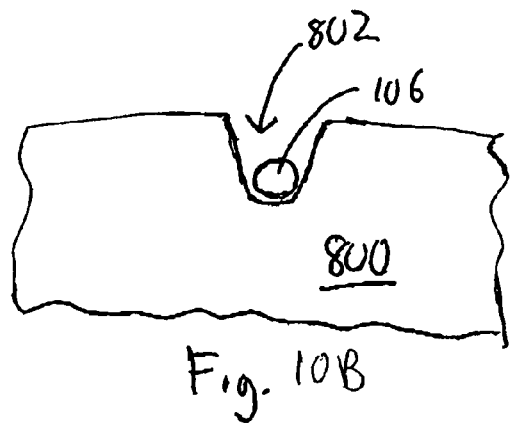
Figure 10C:
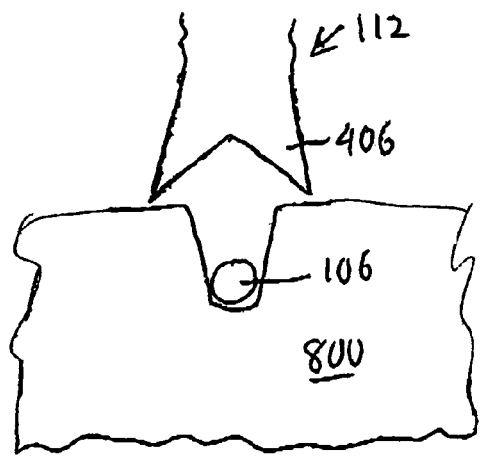
Figure 10D:
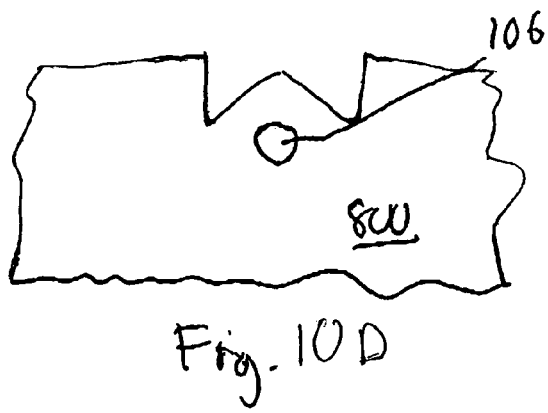

FIGS. 10A-10D show steps during a filament attachment process according to one embodiment. During a filament attachment process, bond tool 112 is brought down onto a device with a wire bond 800, such as an aluminum bond, which puts filament 106 between grooving portion 404 and bond 800, as shown in FIG. 10A. Both ultrasonic energy and pressure are applied to the bond, resulting in grooving portion 404 forming a groove 802 in bond 800. In one embodiment, the grooving process uses a force of 1200 grams for a time of 55 msec, at an ultrasonic power of 90. Note that the ultrasonic power setting or value is based on power settings on bonders from Orthodyne Electronics of Irvine, Calif. Bond tool 112 is then raised away from bond 800, leaving filament 106 in groove 802 formed in bond 800, as shown in FIG. 10B. Next, as shown in FIG. 10C, bond tool 112 is brought down again onto bond 800, with staking portion 406 contacting the bond. Using both ultrasonic energy and pressure, staking portion 406 "closes" the groove formed by grooving portion 404 to embed filament 106 within bond 800, as shown in FIG. 10D. In one embodiment, the staking process uses a force of 1400 grams for a time of 55 msec, at an ultrasonic power of 55. Staking portion 406 has a shallow V-shaped groove, which allows upper portions of the V-shaped groove to first contact the bond, and as the staking portion is brought further down into the bond, the converging sides of the V-shaped groove force the bond material to close over the filament and leave an inverted V-shape on the bond, as shown in FIG. 10D. The motion of bond tool 112 is approximately perpendicular to the bond in its lengthwise direction.

The tool and process of the present invention provides numerous advantages. By incorporating guide portion 402 within bond tool 112, a separate filament guide is not needed, thereby reducing the number of parts for the bonding machine. Further, any alignment issues needed with a separate guide portion are eliminated. The design of the bond tool also allows a filament to be securely attached to a single bond, in contrast to conventional processes that use an overlying bond to secure the filament across another underlying bond. In addition, the filament can be attached with a single pass of the bond head, thereby simplifying the attachment process.

The above-described embodiments of the present invention are merely meant to be illustrative and not limiting. It will thus be obvious to those skilled in the art that various changes and modifications may be made without departing from this invention in its broader aspects. For example, the discussion above has focused on filaments; however, other types of spooled or coiled material may also be suitable, such as wires and optical fibers. Therefore, the appended claims encompass all such changes and modifications as fall within the true spirit and scope of this invention.

What is claimed is:

1. A bond tool for attaching a wire to a bond, comprising:
   a guide portion for guiding the wire along a path, wherein the guide portion is along the path of the wire;
   a grooving portion adjacent to the guide portion for forming a groove in the bond, wherein the grooving portion is approximately inverted V-shaped along the path of the wire; and
   a staking portion adjacent to the grooving portion for closing the groove, wherein the guide portion, grooving portion, and staking portion are all located on the bond tool, and wherein the staking portion is approximately V-shaped along the path of the wire.

2. The bond tool of claim 1, wherein the staking portion has a shallower V-shape than the guide portion.

3. A clamp for holding a wire from a spool, comprising:
   a first clamp arm having a curved first portion and a second portion, wherein the curved first portion is closer to the spool than the second portion; and
   a directly opposing second clamp arm having a curved first portion and a second portion, wherein the curved first portion is closer to the spool than the second portion, wherein a first opening formed from the two curved first portions is wider than a gripping region formed from the two second portions, and wherein the wire enters the clamp through the first curved portions and exits the clamp through a second opening wider than the first opening.

4. The clamp of claim 3, wherein the first clamp arm is fixed and the second clamp arm is moveable.

5. The clamp of claim 3, wherein opposing sides of the first and second clamp arms diverge from the gripping region to the second opening opposite the first opening.

* * * * *